(12) United States Patent
Radhakrishnan et al.

(10) Patent No.: US 12,363,831 B2
(45) Date of Patent: Jul. 15, 2025

(54) BACKSIDE RECESS IN MOTHERBOARD WITH THERMALLY CONDUCTIVE MOLD

(71) Applicant: Intel Corporation, Santa Clara, CA (US)

(72) Inventors: Kaladhar Radhakrishnan, Chandler, AZ (US); Wei Shen, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 275 days.

(21) Appl. No.: 18/015,702

(22) PCT Filed: Sep. 16, 2020

(86) PCT No.: PCT/CN2020/115606
§ 371 (c)(1),
(2) Date: Jan. 11, 2023

(87) PCT Pub. No.: WO2022/056732
PCT Pub. Date: Mar. 24, 2022

(65) Prior Publication Data
US 2023/0189442 A1    Jun. 15, 2023

(51) Int. Cl.
*H05K 1/18* (2006.01)
*H01L 23/00* (2006.01)
(Continued)

(52) U.S. Cl.
CPC .......... *H05K 1/183* (2013.01); *H01L 25/162* (2013.01); *H05K 1/0209* (2013.01); *H05K 1/181* (2013.01);
(Continued)

(58) Field of Classification Search
None
See application file for complete search history.

(56) References Cited

U.S. PATENT DOCUMENTS 5,615,087 A * 3/1997 Wieloch ................. H01L 23/367
257/E23.101
8,264,846 B2 * 9/2012 Jones .................... H05K 1/0231
361/792
(Continued)

FOREIGN PATENT DOCUMENTS

CN    102106194    6/2011

OTHER PUBLICATIONS

International Search Report and Written Opinion for International Patent Application No. PCT/CN2020/115606 mailed Jun. 16, 2021, 9 pgs.

*Primary Examiner* — Timothy J Thompson
*Assistant Examiner* — John B Freal
(74) *Attorney, Agent, or Firm* — Schwabe, Williamson & Wyatt P.C.

(57) ABSTRACT

Embodiments disclosed herein include microelectronic boards and electronic systems. In an embodiment, a microelectronic board comprises aboard substrate, where the board substrate has a first thickness between a first surface and a second surface opposite from the first surface. In an embodiment, a recess is formed into the first surface of the board substrate, where the recess comprises a third surface between the first surface and the second surface. In an embodiment, the board substrate has a second thickness between the third surface and the second surface. In an embodiment, the microelectronic board further comprises a voltage regulator (VR) module attached to the third surface.

20 Claims, 6 Drawing Sheets

(51) Int. Cl.
*H01L 25/16* (2023.01)
*H05K 1/02* (2006.01)
(52) U.S. Cl.
CPC .... *H01L 24/16* (2013.01); *H01L 2224/16225* (2013.01); *H05K 2201/10015* (2013.01); *H05K 2201/1003* (2013.01); *H05K 2201/10734* (2013.01)

(56) References Cited

U.S. PATENT DOCUMENTS

| | | | |
|---|---|---|---|
| 2006/0087012 A1* | 4/2006 | Zhong | H01L 23/50 257/E23.079 |
| 2007/0279881 A1* | 12/2007 | Weir | H05K 1/0231 361/794 |
| 2008/0116589 A1 | 5/2008 | Li | |
| 2017/0141095 A1 | 5/2017 | Bruno | |
| 2020/0020652 A1 | 1/2020 | Hill | |
| 2020/0128673 A1* | 4/2020 | Cheah | H05K 1/182 |

* cited by examiner

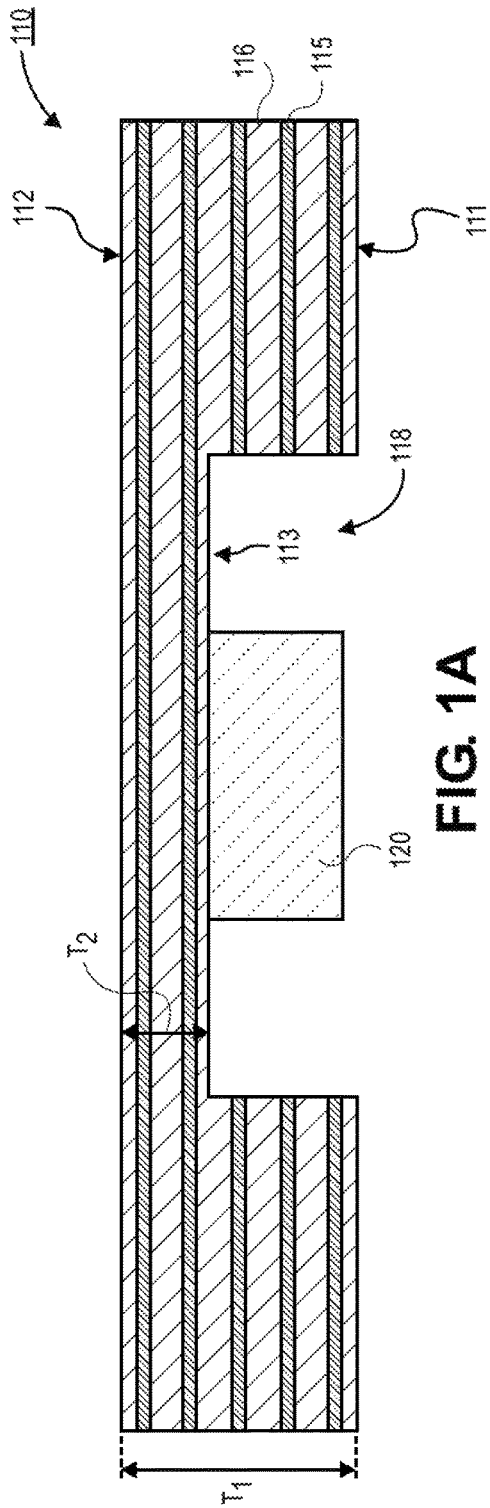
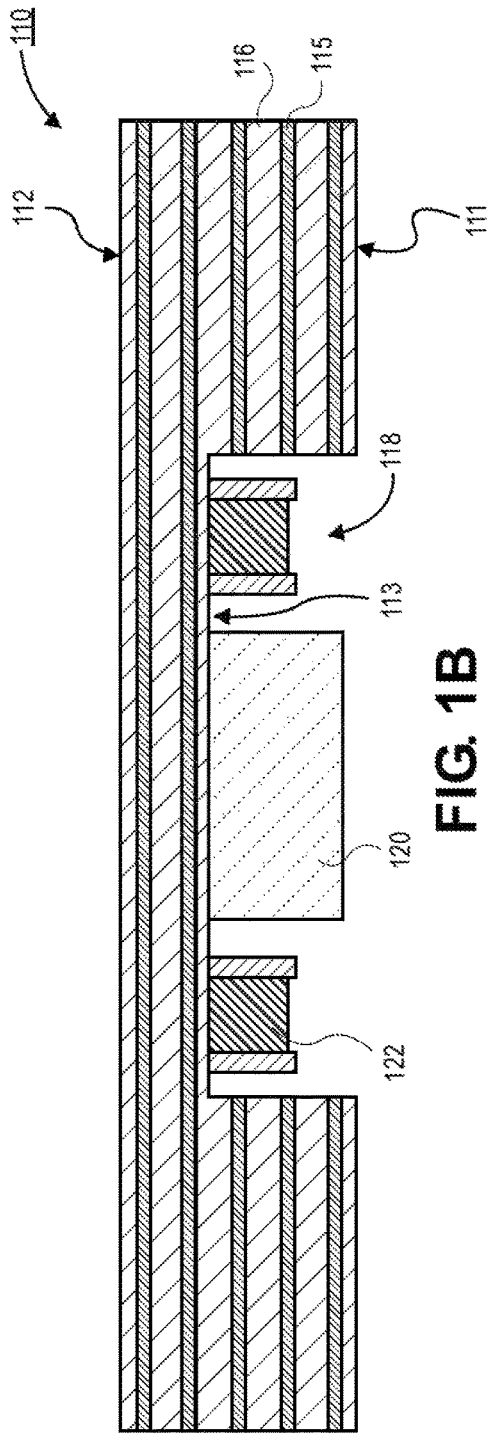

BACKSIDE RECESS IN MOTHERBOARD WITH THERMALLY CONDUCTIVE MOLD

CROSS-REFERENCE TO RELATED APPLICATION

This patent application is a U.S. National Phase Application under 35 U.S.C. § 371 of International Application No. PCT/CN2020/115606, filed Sep. 16, 2020, entitled "BACKSIDE RECESS IN MOTHERBOARD WITH THERMALLY CONDUCTIVE MOLD," which designates the United States of America, the entire disclosure of which is hereby incorporated by reference in its entirety and for all purposes.

TECHNICAL FIELD

Embodiments of the present disclosure relate to semiconductor devices, and more particularly to motherboard architectures that include a backside recess for housing a voltage regulator (VR) module.

BACKGROUND

With the increase in power density, there is a strong push to improve power delivery by moving the voltage regulator (VR) closer to the package. However, as the packages get bigger, it is difficult to move the VR close the CPU. Two solutions have been proposed to address power delivery issues. One solution is to put the VR on the package, and the other solution is to put the VR on the backside of the motherboard.

However, putting the VR on the package adds a lot of cost and complexity to the package. In addition to this, any power dissipated on the VR needs to come out of the socket thermal design power (TDP) budget. Putting the VR on the backside of the motherboard can be a problem if there is not enough clearance on the backside of the motherboard to accommodate the tall VR components (e.g., inductors, transformers, etc.). Another challenge with this option is the inability to effectively cool the VR. Furthermore, as the high power boards get thicker, power delivery performance of the VR and the capacitors on the backside of the motherboard decreases.

BRIEF DESCRIPTION OF THE DRAWINGS

FIG. 1A is a cross-sectional illustration of a board with a backside recess and a voltage regulator (VR) module in the recess, in accordance with an embodiment.

FIG. 1B is a cross-sectional illustration of a board with a backside recess and a VR module and capacitors in the recess, in accordance with an embodiment.

EMBODIMENTS OF THE PRESENT DISCLOSURE

Figure 1C:
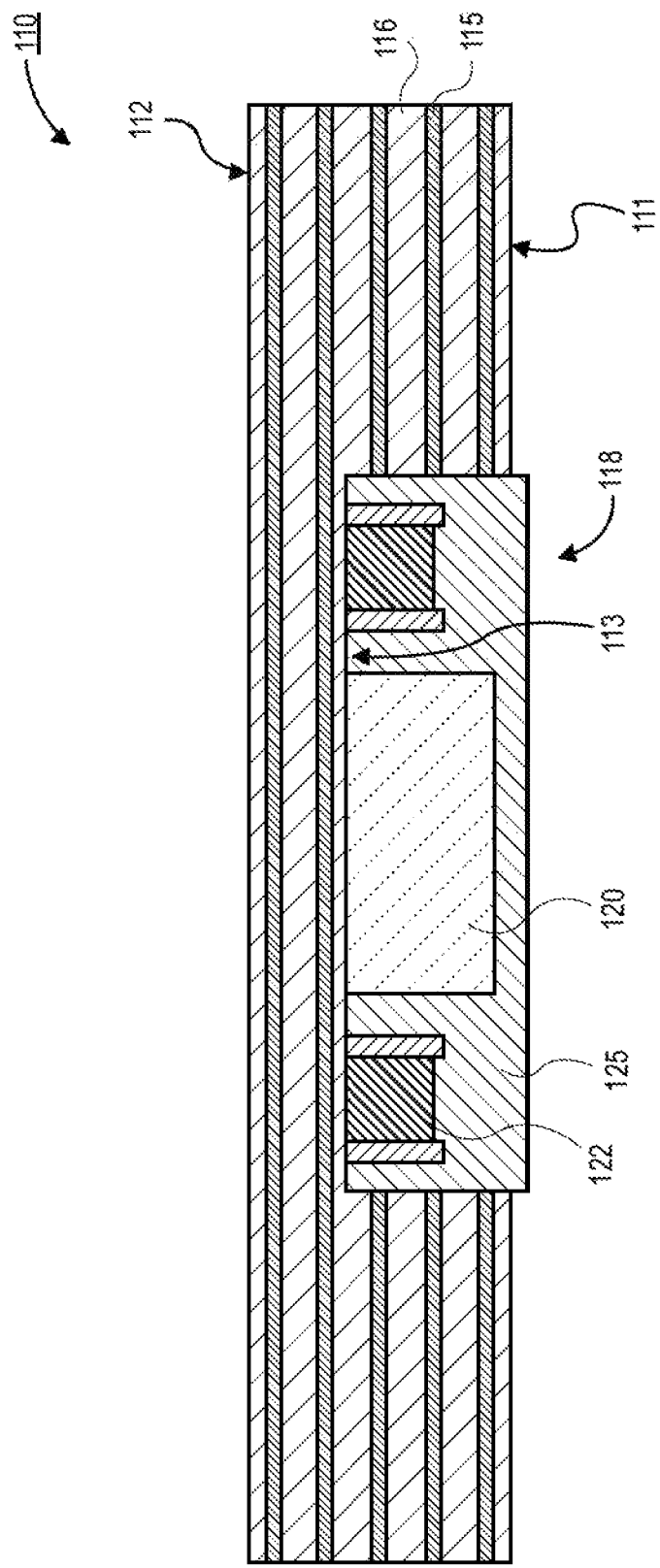
FIG. 1C is a cross-sectional illustration of a board with a backside recess and a VR module in the recess, where a thermally conductive fill material fills the recess, in accordance with an embodiment.

Described herein are motherboard architectures that include a backside recess for housing a voltage regulator (VR) module, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, power delivery concerns are becoming an ever increasing design challenge as power densities increase. One solution is to move the voltage regulator (VR) to the backside of the motherboard. However, in the particular case of motherboards for server packages, the thickness of the motherboard is increasing to accommodate all of the routing layers needed for DDR and PCIe. For example, the motherboard may have a thickness that is approximately 3.0 mm or greater. As used herein "approximately" may refer to a value that is ±10% of the stated value. Such large thicknesses increase the effective impedance seen by the backside components and, as a result, reduce performance. Additionally, providing the VR module on the backside of the motherboard results in thermal control issues, since the VR module cannot be effectively cooled.

Accordingly, embodiments disclosed herein include a recess that is formed on the backside surface of the motherboard. The recess functions to reduce the thickness of the motherboard seen by the VR module that is placed in the recess. For example, the recess may result in a thickness of approximately 1.0 mm or less being seen by the VR module. As such, the effective impedance is reduced, and the performance of the VR module is improved. Additionally, the recess may be filled with a fill material to embed the VR module. In an embodiment, the fill material may be a thermally conductive mold material. As such, heat dissipated by the VR module may be more effectively removed from the system.

Referring now to FIG. 1A, a cross-sectional illustration of a board 110 is shown, in accordance with an embodiment. In an embodiment, the board 110 may be a motherboard, such as a printed circuit board (PCB) or the like. In a particular embodiment, the board 110 is a motherboard for use in a server package, though it is to be appreciated that embodiments are not limited to such uses. For example, the board 110 may be a board 110 for use in personal computing devices, mobile devices, or any other computing platform that utilizes a board 110 onto which one or more electronic packages or other components are mounted.

In an embodiment, the board 110 may comprise a board substrate that includes insulating layers 116 and conductive routing layers 115. The conductive routing layers 115 are shown as parallel traces across the length of the board 110 for simplicity. However, it is to be appreciated that the conductive routing layers 115 may comprise pads, traces, vias, etc. in order to provide the needed electrical routing. In the case of a server board 110, the conductive routing layers 115 may provide the necessary routing for DDR and PCIe. For example, there may be five or more conductive routing layers 115. In some embodiments, the board substrate may also comprise a core (not shown). A core layer may include a fiber reinforced insulating material.

In an embodiment, the board 110 may include a first surface 111 and a second surface 112. As used herein, the first surface 111 may sometimes be referred to as the backside surface, and the second surface 112 may sometimes be referred to as the front side surface. The second surface 112 interfaces with the one or more electronic packages that are mounted to the board 110, and the first surface 111 faces away from the mounted electronic package.

In an embodiment, the board 110 may have a first thickness $T_1$. The first thickness $T_1$ may be the thickness of the board 110 between the first surface 111 and the second surface 112. In some embodiments, the first thickness $T_1$ may be approximately 2.0 mm or greater, or approximately 3.0 mm or greater. Generally, as the complexity of the routing in the board 110 increases, so does the first thickness $T_1$.

In accordance with an embodiment, a recess 118 may be disposed into the first surface 111. The recess 118 may define a third surface 113. In an embodiment, the third surface 113 is substantially parallel to the first surface 111 and the second surface 112, and the third surface 113 is positioned between the first surface 111 and the second surface 112. In an embodiment, the board 110 may have a second thickness $T_2$ between the second surface 112 and the third surface 113. The second thickness $T_2$ is, therefore, smaller than the first thickness $T_1$. As such, backside components mounted on the third surface 113 in the recess 118 will experience a smaller effective impedance than if they were mounted on the first surface 111. In an embodiment, the second thickness $T_2$ may be approximately 2.0 mm or less, or approximately 1.0 mm or less. In an embodiment, the recess 118 pass through one or more of the routing layers 115. For example, in FIG. 1A, the recess 118 passes through three of the five routing layers 115. Additionally, in embodiments that include a core, the recess 118 may also pass through the core.

In an embodiment, a VR module 120 is mounted to the third surface 113 of the board 110. In an embodiment, the VR module 120 may include passive components that are used to provide control of power delivery. For example, the VR module 120 may include inductors, transformers, or the like to provide conversion (e.g., step-down) of voltages supplied to the board 110. In an embodiment, the components of the VR module may include magnetic materials to improve the efficiency of the VR module. In the illustrated embodiment, the VR module 120 is shown as a single block. However, it is to be appreciated that the VR module 120 may comprise a plurality of discrete components attached to the third surface 113. In other embodiments, components of the VR module 120 may be coupled together (e.g., by a molding material) and attached to the third surface 113. While passive components of the VR module 120 are described, it is to be appreciated that in some embodiments, portions of the switching circuitry for implementing the power delivery may also be included on the VR module 120.

Referring now to FIG. 1B, a cross-sectional illustration of a board 110 is shown, in accordance with an additional embodiment. In an embodiment, the board 110 in FIG. 1B may be substantially similar to the board 110 in FIG. 1A, with the exception of there being capacitors 122 provided in the recess 118. In an embodiment, the capacitors 122 may be motherboard capacitors. For example, the capacitors 122 may be necessary to enable proper operation of the board 110. In an embodiment, the capacitors 122 may surround the VR module 120.

Referring now to FIG. 1C, a cross-sectional illustration of a board 110 is shown, in accordance with another additional embodiment. In an embodiment, the board 110 in FIG. 1C may be substantially similar to the board 110 in FIG. 1B, with the exception of the addition of a fill material 125 in the recess 118. In an embodiment, the fill material 125 may comprise a thermally conductive molding material. For example, the fill material 125 may comprise an epoxy with thermally conductive filler particles. Providing a thermally conductive fill material 125 aids in the removal of heat dissipated by the VR module 120 and/or the capacitors 122.

In an embodiment, the fill material 125 substantially fills the remainder of the recess 118. In an embodiment, the fill material 125 may be substantially flush with the first surface 111 of the board 110. In other embodiments, the fill material 125 may extend past the first surface 111, as shown in FIG. 1C. In an embodiment, the VR module 120 and the capacitors 122 may be referred to as being embedded in the fill material 125. Being "embedded" may refer to one or more surfaces of the VR module 120 and the capacitors 122 being contacted and covered by the fill material 125. For example, in FIG. 1C, the sidewalls and backside surfaces of the VR module 120 and the capacitors 122 are contacted and covered by the fill material 125. In some embodiments, the backside surfaces of one or both of the VR module 120 and the capacitors 122 may be exposed. That is, the fill material 125 may only cover the sidewall surfaces of the VR module 120 and/or the capacitors 122.

Figure 2A:
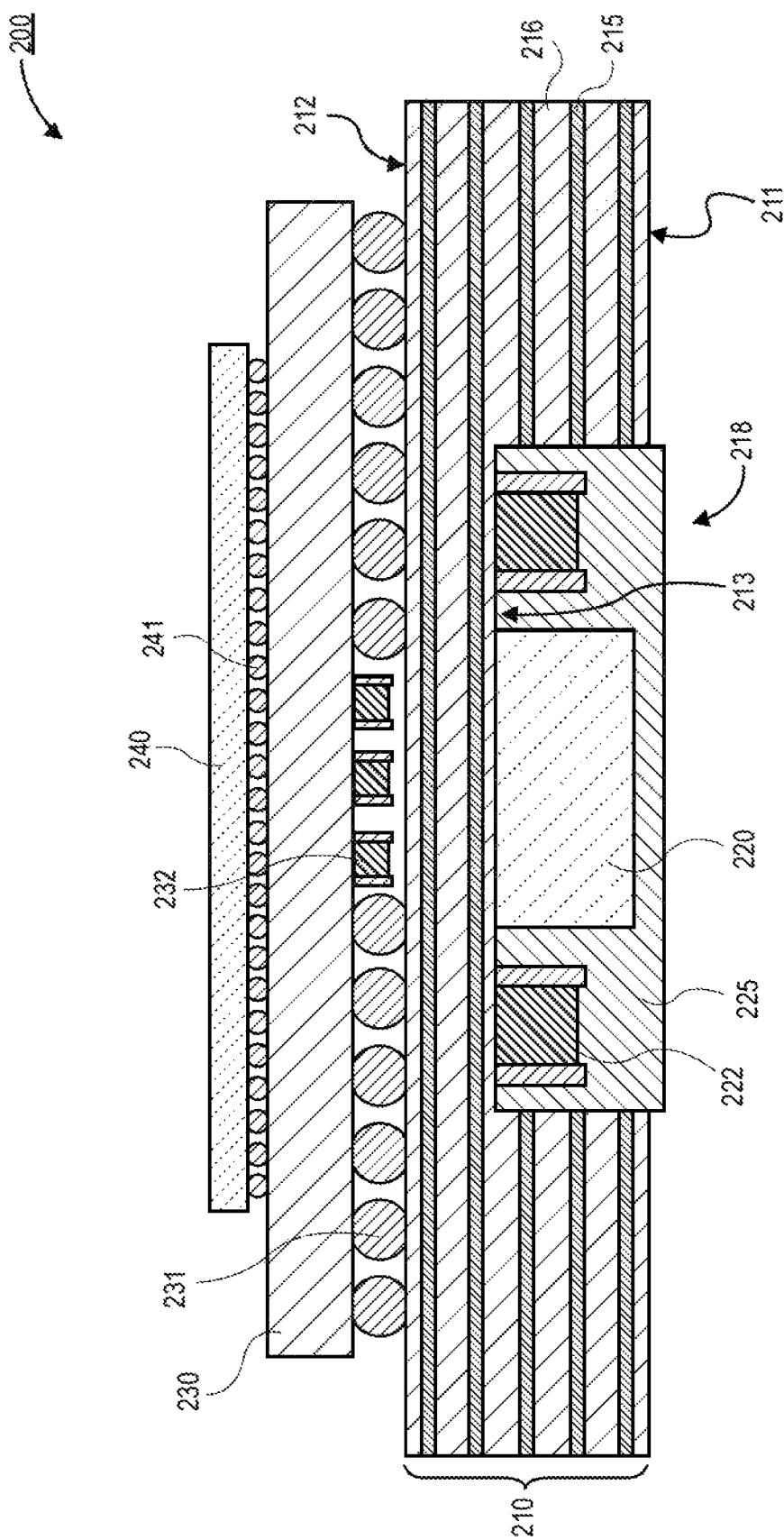
FIG. 2A is a cross-sectional illustration of an electronic system with a board that comprises a backside recess for accommodating a VR module, in accordance with an embodiment.

Referring now to FIG. 2A, a cross-sectional illustration of an electronic system 200 is shown, in accordance with an embodiment. In an embodiment, the electronic system 200 comprises a board 210, a package substrate 230, and a die 240.

In an embodiment, the board 210 may be substantially similar to any of the boards 110 described in greater detail above. For example, the board 210 may comprise a first surface 211 and a second surface 212. The first surface 211 (i.e., the backside surface) faces away from the package substrate 230, and the second surface 212 (i.e., the front side surface) faces the package substrate 230. In an embodiment, the board 210 may comprise insulating layers 216 and conductive routing layers 215.

In an embodiment, the board 210 may comprise a recess 218 that passes through one or more of the conductive routing layers 215. The recess 218 may be formed into the first surface 211. In an embodiment, a third surface 213 may be provided as the floor of the recess 218. The third surface 213 is substantially parallel to the first surface 211 and the second surface 212, and the third surface 213 is positioned between the first surface 211 and the second surface 212. Due to the recess 218, components mounted to the third surface 213 (e.g., the VR module 220 and the capacitors 222) have a shorter path through the board 210 than if the components were mounted to the first surface 211. As such, impedance is decreased and performance is improved. In an embodiment, a thickness of the board 210 between the third surface 213 and the second surface 212 may be approximately 1.0 mm or less.

In an embodiment, the recess 218 may be filled with a fill material 225. The fill material 225 may be a thermally conductive material in order to aid in the dissipation of heat from one or both of the VR module 220 and the capacitors 222. For example, the fill material 225 may comprise an epoxy that includes thermally conductive filler particles. In an embodiment, the VR module 220 and the capacitors 222 may be fully or partially embedded by the fill material 225.

In an embodiment, the package substrate 230 may be electrically and mechanically coupled to the second surface 212 of the board 210 by interconnects 231. In the illustrated embodiment, the interconnects 231 are shown as a ball grid array (BGA) architecture. However, it is to be appreciated that the interconnects 231 may include any suitable architecture, such as a pin grid array (PGA) socket or a land grid array (LGA) socket. In an embodiment, the interconnects 231 may provide a standoff height that allows for the incorporation of capacitors 232 to provide package level decoupling. That is, one or more capacitors 232 may be provided on the landside of the package substrate 230 that faces the board 210.

In an embodiment, the package substrate 230 may provide conductive routing (not shown) to provide electrical connections from a die side surface (i.e., the top surface) to the landside surface (i.e., the bottom surface). In some embodiments, one or more passive components may also be embedded in the package substrate 230. In some architectures active and/or passive bridge dies (not shown) may also be embedded in the package substrate to provide high density routing between components/dies attached to the package substrate 230.

In an embodiment, a die 240 is electrically and mechanically coupled to the die side surface of the package substrate 230 by interconnects 241. In an embodiment, the interconnects 241 may include any first level interconnect (FLI) architecture. For example, the interconnects 241 may include micro bumps, copper pads, or the like. In an embodiment, the die 240 may include any type of die that comprises active switching circuitry. In a particular embodiment, the die 240 may be a system-on-a-chip (SoC). Additionally, while a single die 240 is shown in FIG. 2A, it is to be appreciated that any number of dies 240 may be mechanically and electrically coupled to the package substrate 230.

Figure 2B:
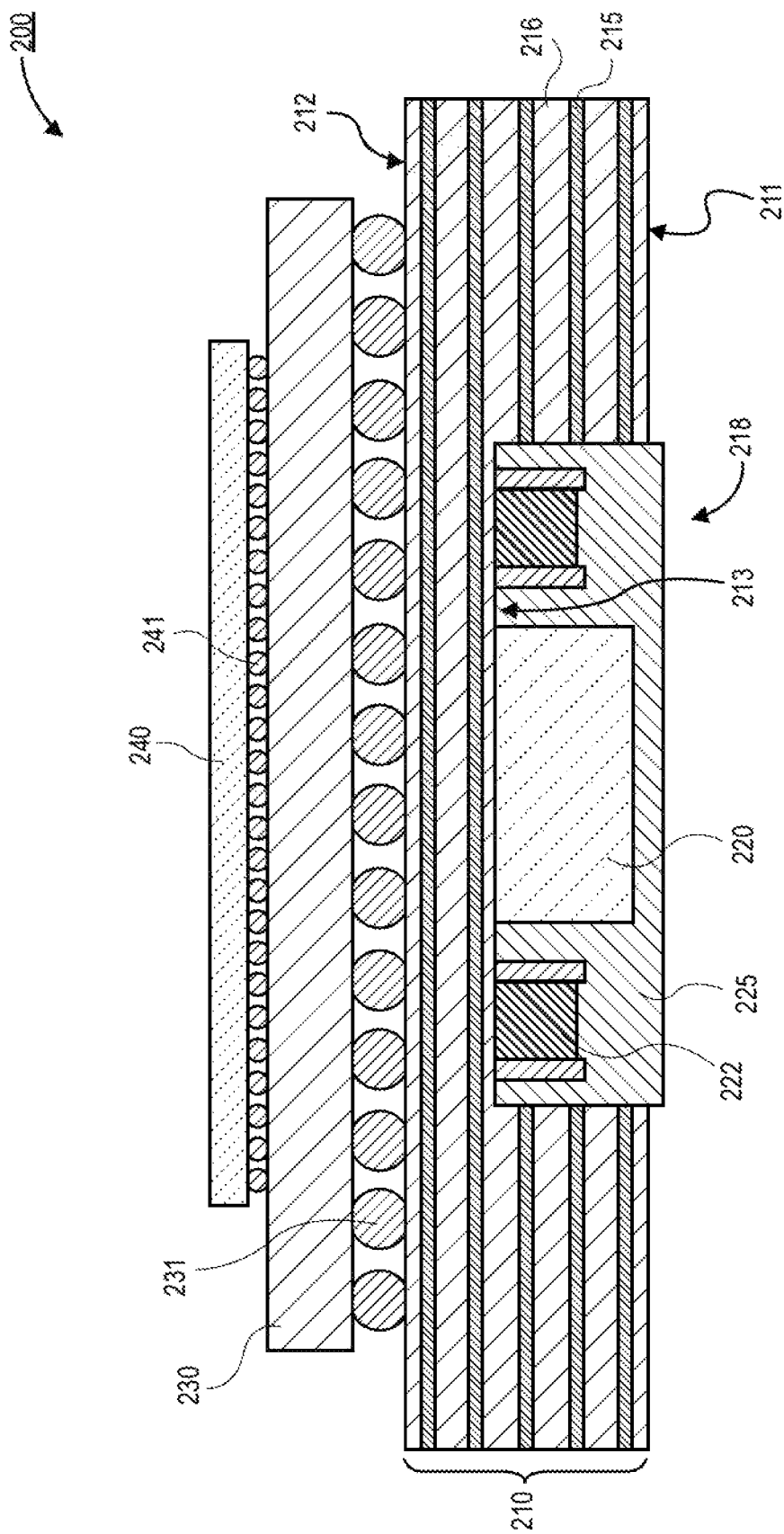
FIG. 2B is a cross-sectional illustration of an electronic system with a board that comprises a backside recess for accommodating a VR module and a full grid array between the package substrate and the board, in accordance with an embodiment.

Referring now to FIG. 2B, a cross-sectional illustration of an electronic system 200 is shown, in accordance with an additional embodiment. In an embodiment, the electronic system 200 in FIG. 2B is substantially similar to the electronic system 200 in FIG. 2A, with the exception that the landside capacitors 232 on the package substrate 230 are removed. Removal of the landside capacitors 232 allows for a full grid array architecture to be used to connect the package substrate 230 to the board 210. In an embodiment, the landside capacitors 232 may be removed when there is enough metal-insulator-metal (MIM) decoupling capacitance provided on the die 240.

Figure 2C:
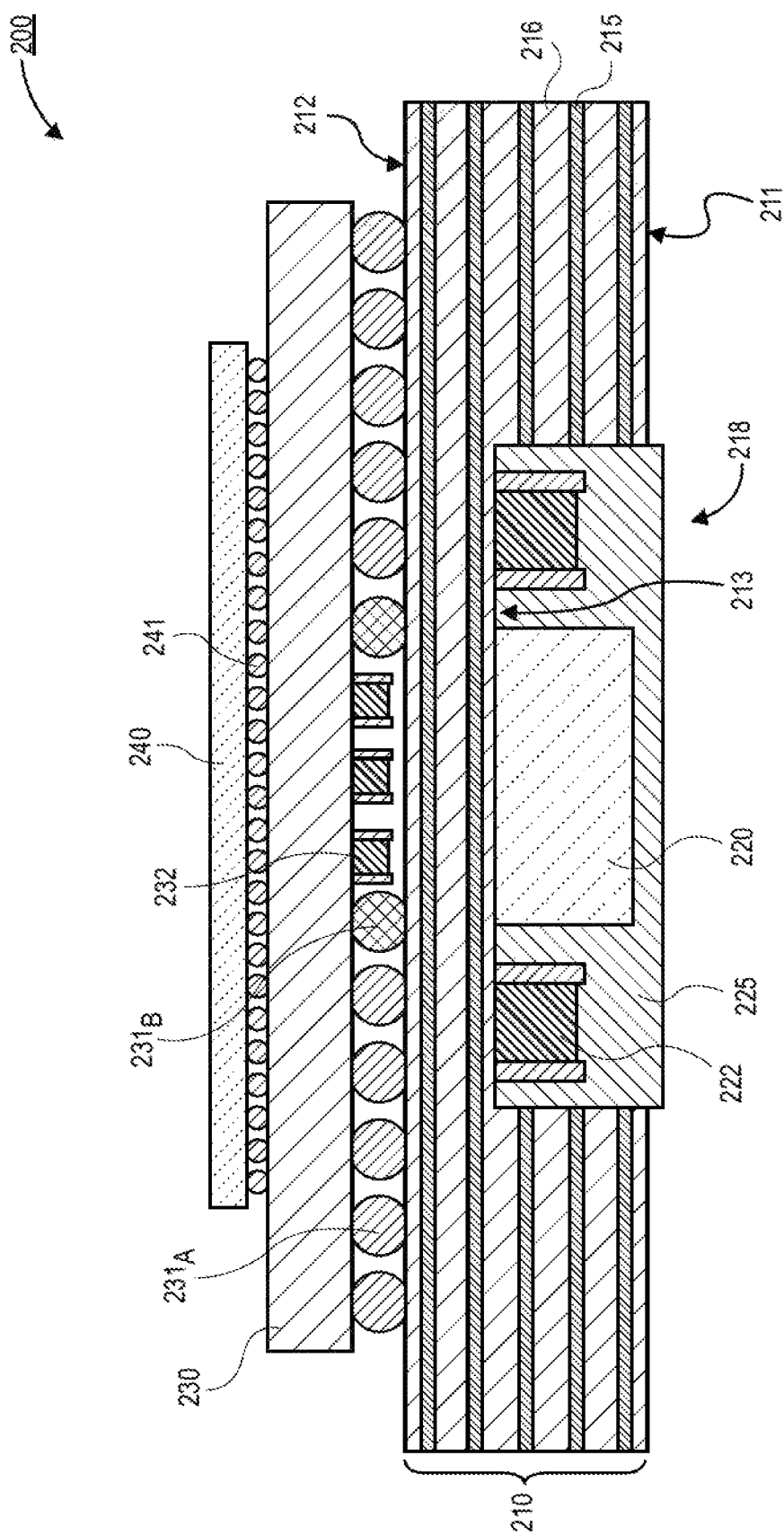
FIG. 2C is a cross-sectional illustration of an electronic system with a board that comprises a backside recess for accommodating a VR module, and power/ground bumps between the board and the package substrate that are adjacent to package capacitors, in accordance with an embodiment.

Referring now to FIG. 2C, a cross-sectional illustration of an electronic system 200 is shown, in accordance with an additional embodiment. In an embodiment, the electronic system 200 in FIG. 2C is substantially similar to the electronic system 200 in FIG. 2A, with the exception of the highlighting of the power and ground (P/G) balls $231_B$. As shown, the P/G balls $231_B$ may be provided immediately around the landside capacitors 232. The remaining I/O balls $231_A$ may make up the remaining portion of the array of balls. Providing the P/G balls $231_B$ immediately adjacent to the landside capacitors 232 provides the shortest power delivery path from the VR module 220 on the backside of the board 210.

Figure 3:
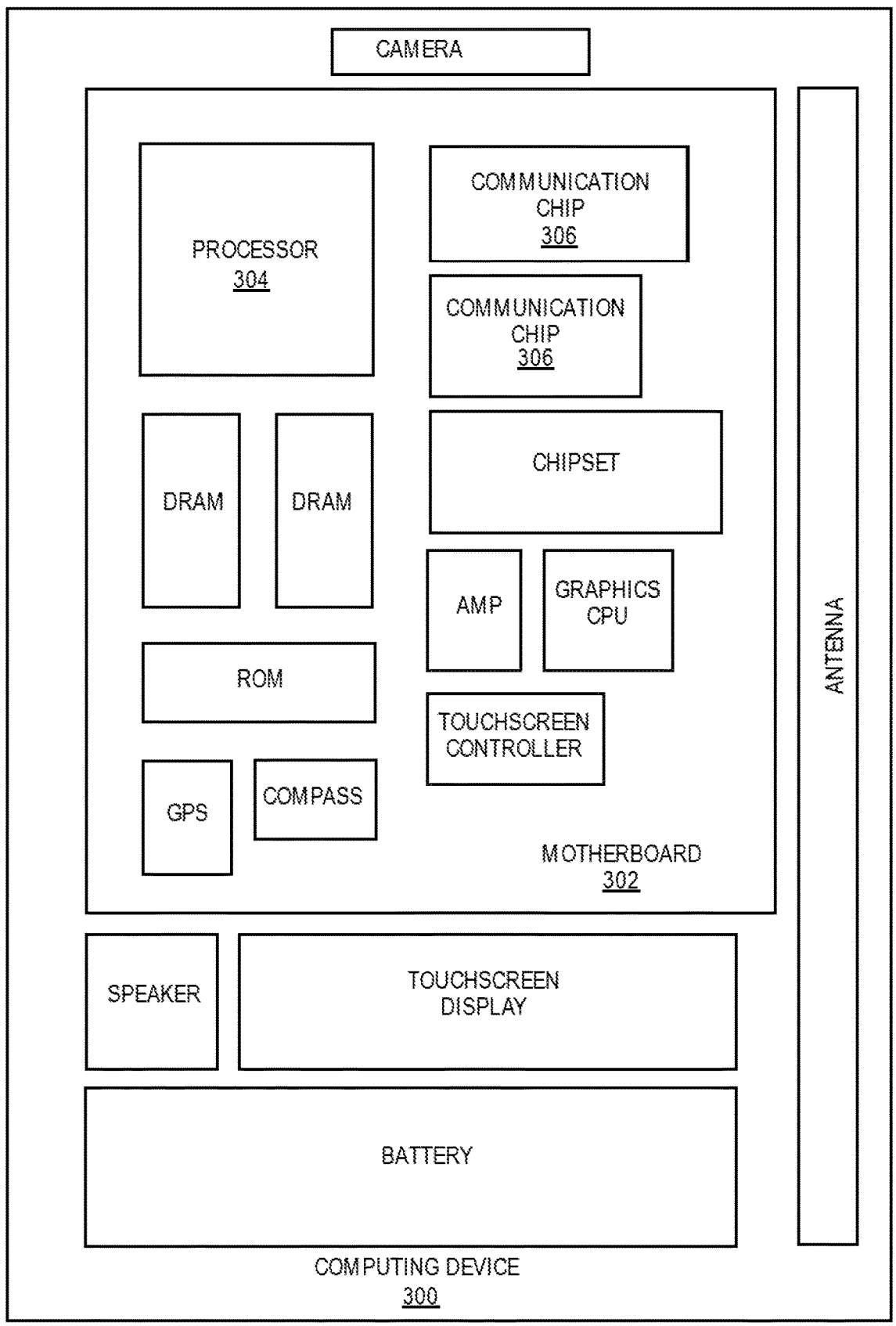
FIG. 3 is a schematic of a computing device built in accordance with an embodiment.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor may be part of an electronic system that comprises a board with a recess on the backside surface and a VR module disposed in the recess, in accordance with embodiments described herein. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip may be part of an electronic system that comprises a board with a recess on the backside surface and a VR module disposed in the recess, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a microelectronic board, comprising: a board substrate, wherein the board substrate has a first thickness between a first surface and a second surface opposite from the first surface; a recess into the first surface of the board substrate, wherein the recess comprises a third surface between the first surface and the second surface, and wherein the board substrate has a second thickness between the third surface and the second surface; and a voltage regulator (VR) module attached to the third surface.

Example 2: the microelectronic board of Example 1, wherein the VR module comprises one or more inductors.

Example 3: the microelectronic board of Example 1 or Example 2, further comprising: a plurality of conductive layers embedded in the board substrate, and wherein the recess passes through at least one of the plurality of conductive layers.

Example 4: the microelectronic board of Example 3, wherein the plurality of conductive layers comprises at least five conductive layers, and wherein the recess passes through at least three conductive layers.

Example 5: the microelectronic board of Examples 1-4, further comprising: a capacitor attached to the third surface.

Example 6: the microelectronic board of Examples 1-5, further comprising: a fill material that fills the recess, wherein the fill material is thermally conductive.

Example 7: the microelectronic board of Example 6, wherein the VR module is fully embedded in the fill material.

Example 8: the microelectronic board of Examples 1-7, wherein the first thickness is approximately 3.0 mm or greater.

Example 9: the microelectronic board of Example 8, wherein the second thickness is approximately 1.0 mm or less.

Example 10: the microelectronic board of Examples 1-9, wherein the first surface of the board substrate is a backside surface, and wherein the second surface is configured to receive an electronic package.

Example 11: the electronic system, comprising: a board with a first surface and a second surface opposite from the first surface, and a recess into the first surface; a voltage regulator (VR) module in the recess; a package substrate attached to the second surface of the board; and a die attached to the package substrate.

Example 12: the electronic system of Example 11, wherein the package substrate is attached to the board with a socket.

Example 13: the electronic system of Example 11 or Example 12, wherein the package substrate is attached to the board with a ball grid array (BGA).

Example 14: the electronic system of Examples 11-13, further comprising: capacitors on a surface of the package substrate facing the board.

Example 15: the electronic system of Examples 11-14, wherein the package substrate is attached to the second surface of the board with a full grid array.

Example 16: the electronic system of Examples 11-15, further comprising: a capacitor in the recess.

Example 17: the electronic system of Examples 11-16, further comprising: a fill material that fills the recess, wherein the fill material is thermally conductive.

Example 18: the electronic system of Example 17, wherein the VR module is embedded by the fill material.

Example 19: an electronic system, comprising: a microelectronic board, wherein the microelectronic board comprises: a board substrate, wherein the board substrate has a first thickness between a first surface and a second surface opposite from the first surface; a recess into the first surface of the board substrate, wherein the recess comprises a third surface between the first surface and the second surface, and wherein the board substrate has a second thickness between the third surface and the second surface; and a voltage regulator (VR) module attached to the third surface; a package substrate attached to the second surface of the board substrate; and a die attached to the package substrate.

Example 20: the electronic system of Example 19, further comprising: a fill material that fills the recess, wherein the fill material is thermally conductive, and wherein the fill material embeds the VR module.

What is claimed is:

1. A microelectronic board, comprising:
a board substrate, wherein the board substrate has a first thickness between a first surface and a second surface opposite from the first surface;
a recess into the first surface of the board substrate, wherein the recess comprises a third surface between the first surface and the second surface, and wherein the board substrate has a second thickness between the third surface and the second surface;
a voltage regulator (VR) module attached to the third surface; and
a fill material that fills the recess, the fill material having an uppermost surface above the first surface of the board.

2. The microelectronic board of claim 1, wherein the VR module comprises one or more inductors.

3. The microelectronic board of claim 1, further comprising: a plurality of conductive layers embedded in the board substrate, and wherein the recess passes through at least one of the plurality of conductive layers.

4. The microelectronic board of claim 3, wherein the plurality of conductive layers comprises at least five conductive layers, and wherein the recess passes through at least three conductive layers.

5. The microelectronic board of claim 1, further comprising: a capacitor attached to the third surface.

6. The microelectronic board of claim 1, wherein the fill material is thermally conductive.

7. The microelectronic board of claim 6, wherein the VR module is fully embedded in the fill material.

8. The microelectronic board of claim 1, wherein the first thickness is approximately 3.0 mm or greater.

9. The microelectronic board of claim 8, wherein the second thickness is approximately 1.0 mm or less.

10. The microelectronic board of claim 1, wherein the first surface of the board substrate is a backside surface, and wherein the second surface is configured to receive an electronic package.

11. An electronic system, comprising:
   a board with a first surface and a second surface opposite from the first surface, and a recess into the first surface;
   a voltage regulator (VR) module in the recess;
   a fill material that fills the recess, the fill material having an uppermost surface above the first surface of the board;
   a package substrate attached to the second surface of the board; and
   a die attached to the package substrate.

12. The electronic system of claim 11, wherein the package substrate is attached to the board with a socket.

13. The electronic system of claim 11, wherein the package substrate is attached to the board with a ball grid array (BGA).

14. The electronic system of claim 11, further comprising: capacitors on a surface of the package substrate facing the board.

15. The electronic system of claim 11, wherein the package substrate is attached to the second surface of the board with a full grid array.

16. The electronic system of claim 11, further comprising: a capacitor in the recess.

17. The electronic system of claim 11, wherein the fill material is thermally conductive.

18. The electronic system of claim 17, wherein the VR module is embedded by the fill material.

19. An electronic system, comprising:
   a microelectronic board, wherein the microelectronic board comprises:
      a board substrate, wherein the board substrate has a first thickness between a first surface and a second surface opposite from the first surface;
      a recess into the first surface of the board substrate, wherein the recess comprises a third surface between the first surface and the second surface, and wherein the board substrate has a second thickness between the third surface and the second surface; and
      a voltage regulator (VR) module attached to the third surface;
      a fill material that fills the recess, the fill material having an uppermost surface above the first surface of the board;
      a package substrate attached to the second surface of the board substrate; and
      a die attached to the package substrate.

20. The electronic system of claim 19, wherein the fill material is thermally conductive, and wherein the fill material embeds the VR module.

* * * * *